(12) United States Patent
Cher et al.

(10) Patent No.: US 8,542,030 B2
(45) Date of Patent: Sep. 24, 2013

(54) THREE-DIMENSIONAL (3D) STACKED INTEGRATED CIRCUIT TESTING

(75) Inventors: Chen-Yong Cher, Port Chester, NY (US); Eren Kursun, Ossining, NY (US); Gary W. Maier, Poughquag, NY (US); Raphael Peter Robertazzi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 12/942,662

(22) Filed: Nov. 9, 2010

(65) Prior Publication Data

US 2012/0112776 A1 May 10, 2012

(51) Int. Cl.
*G01R 31/26* (2006.01)

(52) U.S. Cl.
USPC .................................................. 324/762.01

(58) Field of Classification Search
USPC ................. 324/762.01–762.1, 750.01–750.3, 324/763.01–763.02; 257/48, 678; 438/109, 438/106, 14–18
See application file for complete search history.

(56) References Cited

U.S. PATENT DOCUMENTS

| | | | |
|---|---|---|---|
| 5,686,843 A | 11/1997 | Beilstein, Jr. et al. | |
| 5,898,706 A | 4/1999 | Dufresne et al. | |
| 5,923,181 A | 7/1999 | Beilstein, Jr. et al. | |
| 5,956,279 A | 9/1999 | Mo et al. | |
| 6,122,760 A | 9/2000 | Grosch et al. | |
| 6,326,800 B1 | 12/2001 | Kirihata | |
| 6,455,336 B1 | 9/2002 | Berndlmaier et al. | |
| 6,680,212 B2 * | 1/2004 | Degani et al. | 438/14 |
| 7,186,576 B2 * | 3/2007 | Cobbley et al. | 438/14 |
| 7,268,570 B1 | 9/2007 | Audet et al. | |
| 7,548,080 B2 | 6/2009 | Abadeer et al. | |

* cited by examiner

*Primary Examiner* — Tung X Nguyen
(74) *Attorney, Agent, or Firm* — Cantor Colburn LLP; William Stock

(57) ABSTRACT

Testing of a three-dimensional (3D) integrated circuit includes defining a first group of parts by a region and/or layer on the 3D integrated circuit. The testing further includes applying a first intensity of stress test conditions to the first group of parts. The testing also includes defining a second group of parts by a region and/or layer on the 3D integrated circuit that is different from the first group of parts. The testing further includes and applying a second intensity of stress test conditions to the second group of parts. The second intensity of stress test conditions is greater than the first intensity and is determined by sensitivities identified for each of the first and second group of parts. A determination is made whether the 3D integrated circuit passed the testing based upon results of application of the first and second intensities of stress test conditions.

25 Claims, 5 Drawing Sheets

US 8,542,030 B2

THREE-DIMENSIONAL (3D) STACKED INTEGRATED CIRCUIT TESTING

BACKGROUND

This invention relates generally to integrated circuits, and more particularly to heterogeneous stacked integrated circuit testing.

Computer chips and integrated chip stacks are tested during the manufacturing process, as well as post manufacturing to ensure high quality and reliability. One type of such testing (sometimes referred to as "burn-in") involves stressing the chip stacks with the varying levels of voltages and temperatures to ensure the chip stacks can withstand a minimum level of such applied stress. Performing this testing prior to shipping the chip stacks can minimize early failures, referred to as "infant mortality."

However, burn-in testing is becoming increasingly challenging due to various factors. For example, test procedures performed on one particular component can damage other more sensitive, nearby components on the chip or stack layers, thereby reducing the overall yield of the final chip stack product. Also, controlling on-chip temperatures during the high-voltage, high temperature burn-in stages can be difficult due to increases in on-chip power dissipation and temperature/leakage dependency. As a result, many stress testing techniques apply shorter periods of high-temperatures/high-voltages to components in order to minimize the likelihood of such conditions.

In addition, testing processes for high-power, three-dimensional (3D) microprocessor architectures also present significant challenges. In computer chip manufacturing, 3D stacked layers of components (e.g., processing chips and memory) are combined in a way that decreases the distance that data must travel between the components. As a result, overall system performance can be improved by leveraging the increased interconnectivity inherent in 3D stacks, particularly in a heterogeneous stacking context (e.g., disparate technologies, different technology generations, and various circuit and layer types from a functional perspective). Providing a stack-level test configuration for such a range components is challenging since sometimes a test requirement for a layer can be completely harmful for a sensitive layer nearby. Furthermore, since the on-chip temperatures are already high in 3D chip stacks, the additional thermal and reliability stress in burn-in testing can very easily damage parts of the processor. The margin of operation for such stack level burn-in is limited, thereby rendering burn-in testing impractical in many cases.

Further, heterogeneous 3D chip stacks incorporate device layers with disparate technologies (e.g. MEMS, SOI), different technology generations, such as 65 nm and 45 nm) and different characteristics (e.g., analog, digital, variations in chip sizes, aspect ratios, and chip thicknesses, as well as varying operating point specifications, such as clock frequencies, applied voltages, and characteristics of wiring layers). As a result, the sensitivity to burn-in in such heterogeneous stacks can be quite high (e.g., while stressing one of the layers in the stack, another layer, which is more sensitive, may become damaged in the process).

While wafer-level or single stratum test data can be very useful and informative in the testing process, it is insufficient for 3D chip stacks. The reliability characteristics of the 3D chip stack may be impacted by the assembly stages that typically involve abrasive or higher risk, steps such as chemical mechanical planarization (CMP), high-temperatures, compression bonding, and the like, with potentially negative implications on the underlying device layers.

SUMMARY

An exemplary embodiment includes a method of testing a three-dimensional (3D) integrated circuit. The method includes defining a first group of parts by a region and/or layer on the 3D integrated circuit. The method also includes applying a first intensity of stress test conditions to the first group of parts on the 3D integrated circuit. The method also includes defining a second group of parts by a region and/or layer on the 3D integrated circuit that is different from the region or layer of the first group of parts. The method further includes applying a second intensity of stress test conditions to the second group of parts on the 3D integrated circuit. The second intensity of stress test conditions is different from the first intensity of stress test conditions and is determined by sensitivities identified for each of the first group of parts and the second group of parts. A determination is made whether the 3D integrated circuit passed the testing based upon results of application of the first and second intensities of stress test conditions.

Another exemplary embodiment includes a system of testing a three-dimensional (3D) integrated circuit. The system includes a controller device in communication with the 3D integrated circuit, a voltage regulator, and a temperature actuator. The controller device includes logic for implementing a method. The method includes defining a first group of parts by a region and/or layer on the 3D integrated circuit. The method also includes applying a first intensity of stress test conditions to the first group of parts on the 3D integrated circuit. The method also includes defining a second group of parts by a region and/or layer on the 3D integrated circuit that is different from the region or layer of the first group of parts. The method further includes applying a second intensity of stress test conditions to the second group of parts on the 3D integrated circuit. The second intensity of stress test conditions is different from the first intensity of stress test conditions and is determined by sensitivities identified for each of the first group of parts and the second group of parts. A determination is made whether the 3D integrated circuit passed the testing based upon results of application of the first and second intensities of stress test conditions.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Exemplary embodiments of the present invention provides for a heterogeneous three-dimensional (3D) integrated circuit and method of stress testing thereof. In an exemplary embodiment, stress testing refers to the application of heat and/or voltage to an integrated circuit in order to detect any weaknesses of the integrated circuit components. The testing may include burn-in stress patterns, which can control the switching activity and intensity of burn-in through the power dissipation. The application may be implemented for a specified duration of time, and may be implemented as a frequency (off and on sequences of application) over a specified duration of time. Various types of stress testing may be determined and one or more of the test types may be selected for implementation. Examples of types of stress testing include standard burn-in, adjusted full-stack burn-in, and spatial burn-in, as will be described herein.

In an embodiment, one type of testing includes spatial stress testing (e.g., spatial burn-in) of the heterogeneous 3D integrated circuit. The exemplary method and system activates spatial, partial burn-in for multi-core, 3D stacked integrated circuits. In one exemplary embodiment, the method and system selectively applies varying intensities of stress test conditions to different device layers on a chip in a 3D chip stack, as well as different regions within a layer, and/or a region that spans more than one layer in order to minimize the occurrence of burn-in related complications for the rest of the chip stack.

Data from earlier design stages (e.g., test specifications and sensitivities from technology guidelines, designer and system guidelines, as well as prior analysis) is made available and is analyzed in order to selectively stress the device layers and the corresponding intensities. In an exemplary embodiment, the testing processes focus on the selective areas in the chip stack in a sequential fashion and otherwise avoid the aforementioned risks involved in performing a stack-level stress test.

In an exemplary embodiment, on-chip test hardware generates stress test conditions to test the chip partially/spatially for stress. While activating/stressing a first region or layer, e.g., it selects intensities of stress test conditions for the other layers and regions for optimal test coverage, while minimizing the damage from the applied stress. The intensities of stress test conditions for a temperature actuator include varying degrees of heat or cooling. The intensities of stress test conditions for a voltage regulator include varying amounts of voltage.

The exemplary method includes inputting test data from previous test stages (e.g., wafer level data, or pre-assembly) and contains operating constraints for the chip stack. The exemplary method, then selects a desired state based, in part, on the voltage per region/layer and temperature per region/layer.

Figure 1:
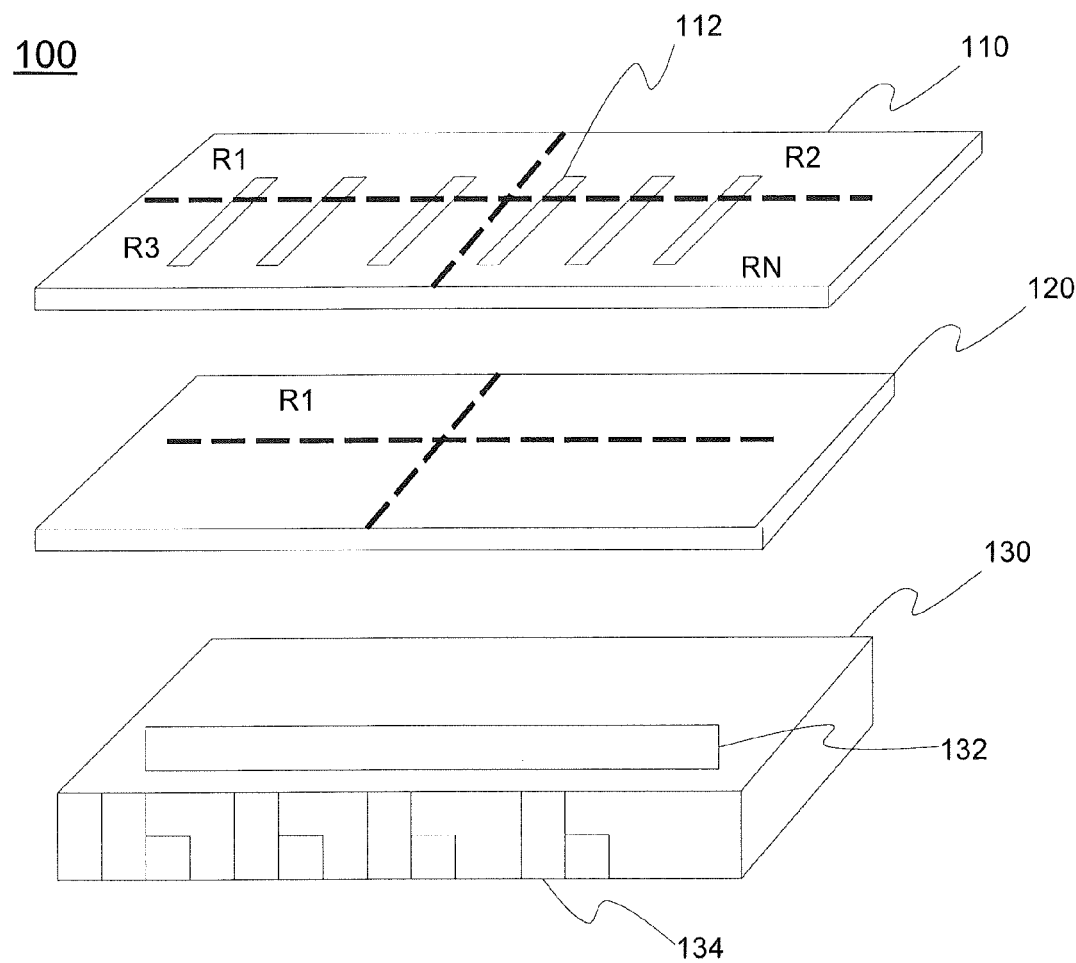
FIG. 1 depicts an exploded view of a heterogeneous three-dimensional computer processing chip stack in accordance with an exemplary embodiment.

FIG. 1 illustrates an exploded view of an exemplary heterogeneous 3D chip stack 100 will now be described. The heterogeneous chip stack 100 (also referred to herein as "chip stack") shown in FIG. 1 includes three layers L1-130, L2-120, and L3-110. The layers 110, 120, and 130 may be formed of semiconductor material and include various components or structures, such as logic, memory, and core processors (not shown). The layers 110, 120, and 130 are integrated (e.g., stacked) to form a portion of the chip stack 100. For example, layer 130 may be disposed on layer 120, and layer 120 may be disposed on layer 110. While the three layers 110, 120, and 130 are illustrated in FIG. 1 as forming part of the 3D chip stack 100, it will be understood that additional (or fewer) layers may be employed in order to realize the advantages of the exemplary embodiments.

In an exemplary embodiment, the components on the layers 110, 120, and 130 may include a power supply and a clock grid, and may support various voltage supplies and clock grids. Once integrated with the chip stack 100, the components within the layers 110, 120, and 130 may be communicatively coupled to the respective layers, e.g., via wiring or wire mesh (not shown).

As indicated above, a variety of types of chips may be included on the layers 110, 120 and 130, such that at least one of the chips disposed on one layer has properties or characteristics that are different from those of others of the chips on the layers 110, 120, and 130. These heterogeneous properties may include, e.g., different technology types (e.g., 180 and 32 nanometer (nm) chips) and different circuit types (e.g., analog, digital, memory, logic, and microelectromechanical systems (MEMS) to name a few). Another embodiment of a heterogeneous stacked chip is a dynamic random access memory (DRAM) layer and a 45 nm logic layer. A third embodiment may be a field-programmable gate array (FPGA) layer and an analog device layer. Furthermore, the chips provided on the layers 110, 120, and 130 may be configured for various functions (e.g., the chips may be cache chips, floating point accelerators, encryption and decryption accelerators, or any other type of computer chip as is known in the art).

In an exemplary embodiment, the chip stack 100 includes a specialized set of voltage regulators/converters 134 and temperature actuators 112/132 per region. By way of non-limiting example, as shown in FIG. 1, layer 3 (110) of the chip stack 100 includes wire-based temperature actuators 112 spread across several defined regions (R1 . . . RN), and level 1 (130) of the chip stack 100 employs latch based temperature actuators 132. In one exemplary embodiment, the chip stack 100 includes on-chip storage of test conditions and actuator specifications (shown in FIG. 3), as well as an on-chip test controller to activate and perform testing of the chip stack 100 on a per-region and/or per-layer level. In an exemplary embodiment, a region of a chip stack 100 layer may refer to a portion of the layer (that is smaller in size or measurements than the layer). In another exemplary embodiment, the region itself within a layer may be defined by the functionality associated with components within the layer (e.g., two components disposed on a layer may be defined as a first region, i.e., a first region is comprised of component 1 and component 2 residing in a location on a first layer). Each region, and its constituent components, is also referred to herein as a group of parts. The components in the region are proximally located with respect to one another. The regions may be defined as described above and the definitions stored in an on chip or off-chip storage location, as described further herein.

In one exemplary embodiment, liquid cooling channels may be employed as temperature actuators (e.g., by pumping in heated or cooling liquid to desired regions/layers of the chip stack 100). These, and other exemplary features, are shown and described further herein.

In an exemplary embodiment, a first voltage level (also referred to herein as a first intensity of stress test conditions) is applied to one or more critical cores (e.g., regions or groups of parts) in the multi-core architecture in the chip stack 100, while maintaining the rest of the chip stack 100 or a portion thereof at a lower voltage and temperature. For example, a multiple of the normal operating supply voltage level) may be applied to a critical core in the chip stack 100, and 1.0V may be applied to the remaining components or a group of parts in the chip stack 100. Since the inter-layer thermal resistances are high, the burn-in or stress conditions can be simulated independently in individual device layers. By selecting particular groupings of components or layers of the chip stack 100, their individual device layers and/or regions may be used as a thermal buffer during testing in order to accommodate or protect other regions/layers' sensitivities to the testing. Likewise, by selecting particular groupings for test, the properties or characteristics of a grouping or layer may be used to enhance or boost (e.g., increase the temperature) the testing properties of other regions/layers on the chip stack 100. The exemplary process continues whereby stress testing is selectively and sequentially applied to device layers and critical cores or regions.

In a further exemplary embodiment, a type of stress testing to be implemented is determined for a given chip stack 100. Types of stress testing may include standard stress test, spatial stress test, and adjusted full-stack stress test. Standard stress testing involves operating the device under test (DUT) at an elevated temperature and voltage for a period of time. A standard typical in the industry is 140 C at 1.5× nominal operating voltage. An adjusted stress test may subject the DUT to either higher or lower temperatures and/or voltage biases, dependent on the fabrication technology used to manufacture the DUT.

Standard stress testing of semiconductor devices consists of executing random test patterns and diagnostics software routines at elevated voltage and temperature conditions to get as many functions of a chip design operating simultaneously in a continuous, intense, and random set of sequences that exceed normal operating conditions of the chip. These tests may be run for many hours to accelerate the use conditions and detect reliability failures caused by defects in the design. In standard stress testing these burn-in conditions and test patterns are engineered to prevent unintended problems from occurring when certain combinations of functions and events occur coupled with the elevated controlled temperature and voltage environment. These events can easily result in self heating and increased currents that could cause unintended damage to a chip that is exposed to a condition it will never see in the real world application. Problems such as latchup, data corruption, data bus contention, thermal run away and current spikes should be avoided. With the complexities associated with stacked heterogeneous chip designs and technologies, managing the stress testing becomes even more complicated and very important to control. The exemplary embodiments describe a stress test infrastructure which provides an adjusted stress test that is extremely organized. Randomly selected tests are avoided with this adjusted stress test. In an exemplary embodiment, each chip and chip region in the stack is evaluated for proper temperature, voltage and test patterns to be used. During stress test execution, adjusted tests and conditions may take turns executing and interrupt or lock out points of conflict. Other safe guards include carefully monitoring and adjusting on-chip region temperatures and power supply operating currents by adjusting chip voltages and the on chip heaters or cooling elements. A combination of external tester controls and software coupled with a new on-chip burn-in test interface (BTI) and/or an embedded spatial burn in controller (eSBC) that controls regional control devices are used to create the exemplary adjusted stress testing environment. This will ensure adequate stressing of the entire stack but in a more organized, optimized, and efficient manner.

Figure 2A:
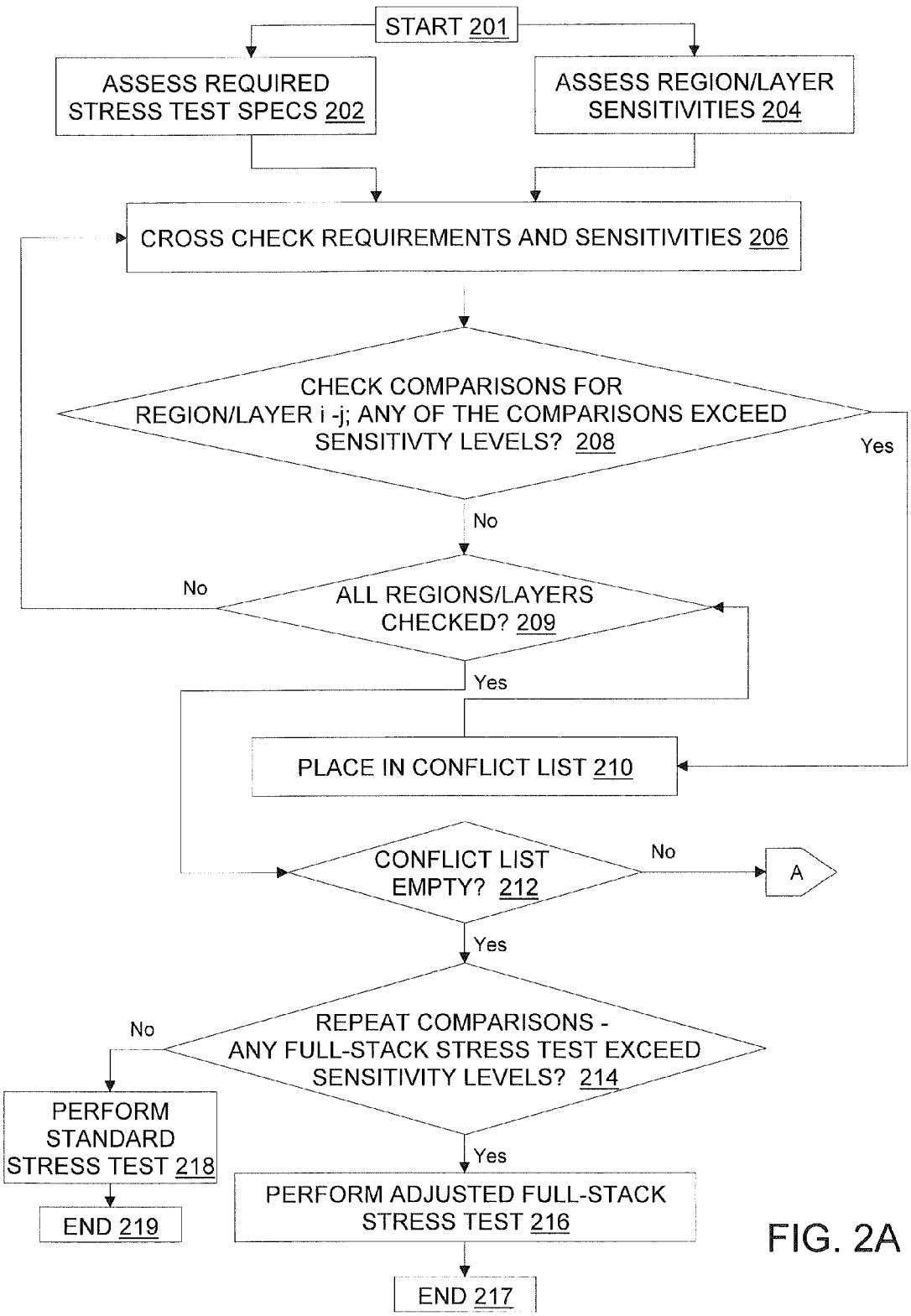
FIGS. 2A-2B depict flow diagrams describing a process for determining a particular type of testing for implementation on a heterogeneous three-dimensional chip stack, and testing the heterogeneous three-dimensional computer processing chip stack according to a selected type of test in an exemplary embodiment.
Figure 2B:
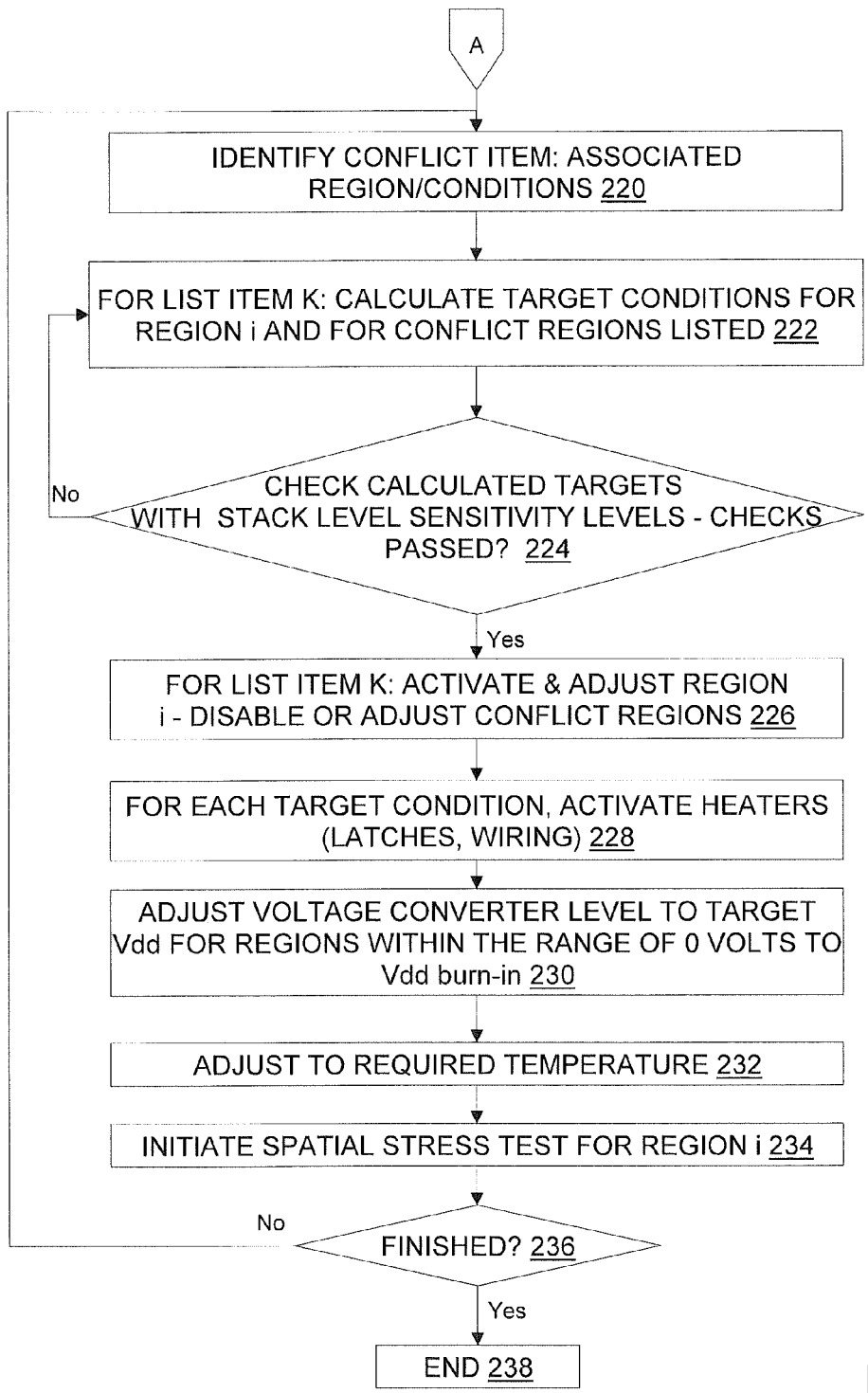

Turning now to FIGS. 2A-2B, an exemplary process for heterogeneous 3D integrated circuit testing will now be described. Steps 202-214 determine the type of stress test that will be applied to the chip stack 100, and steps 220-234 describe a process for implementing an exemplary spatial stress test of the chip stack 100 based upon the analysis performed in steps 202-214. The exemplary processes described in FIGS. 2A-2B may be implemented in application-specific integrated circuits (ASICs), a micro-controller, or in software form and executed by a microprocessor. In one exemplary embodiment, a controller includes a computer processor and software elements to perform the analysis described in FIG. 2 and activates/adjusts various voltage regulators (e.g., voltage regulator 134 of FIG. 1) and temperature actuators (e.g., wire-based actuators 112 and latch-based actuator 132 of FIG. 1) to perform a specified type of stress test on the chip stack 100 as will now be described. In another exemplary embodiment, the analysis described in FIG. 2A may be implemented by a separate computer processor and software executed off-chip whereby the results of the analysis are distributed to a controller for testing. In this embodiment, the controller stores information such as voltage or DAC settings for voltage, temperature, and timing comparisons/ changes, and performs the stress testing using this information. The controller may be an on-chip controller, an off-chip controller, or a combination thereof.

The process begins at step 201, whereby the controller assesses required stress test specifications at step 202. These specifications may be stored in a storage location residing on the chip stack 100 or may be stored off-chip (e.g., in a computer processor or tester memory). The specifications may include, e.g., an applied temperature, pattern specifications, an applied voltage, a required duration of the applied temperature, and a cycling frequency (e.g., alternation of heating up and cooling down a region/layer that fluctuates at specified frequencies). Test Patterns, pattern cycle time, duty cycle, and turning chip functions on and off may also be adjusted. Test specifications for semiconductors are created early in the design and technology development phase. They are generally created with received input from systems customers who establish their preferred environmental conditions and power and performance targets. This input may then be used by a technology development team to begin the process and device definition. A whole new set of process and device specifications may then be derived to establish safe and reliable operating limits on the devices and wiring technology. A set of design ground rules along with test and stress conditions are established for the manufacturing teams to follow which will ensure safe and reliable testing. These specifications may include elements, such as operating temperature, voltage, and timing. Steady or constant current as well as peak current may also be specified. Device switching activity and duty cycles may also be specified. Combinations of all of these specifications may then be used at elevated specification levels during stress testing to accelerate life use and surface any reliability defects.

In a 3D stack, since the layers are in immediate proximity of each other their burn-in processes affect the other layers as well. These specification combinations create a lot of interaction and can create exponential effects at elevated conditions. Thus, an additional set of stress specifications may be established, which include contingencies based on which stress tests are applied and/or how they are applied. 3D test and stress specifications may need to be more carefully engineered due to the complex and multi-dimensional nature of these designs.

These specifications may be stored in a storage location accessible to the controller or other system component implementing the analysis and stress testing.

At step 204, the controller assesses region/layer sensitivities. In one embodiment, the sensitivities refer to a level or range of temperature, voltage, and/or temperature/voltage duration and/or frequency beyond which a region/layer cannot tolerate (i.e., cannot function according to its specifications).

At step 206, the controller implements a cross-check of the requirements and sensitivities. For example, for each region or layer, a temperature specification (from step 202) is compared to a maximum temperature determined by the sensitivity data (from step 204). In a second comparison, for each region or layer, a voltage specification (from step 202) is compared to a maximum voltage determined by the sensitivity data (from step 204). Likewise, a duration of applied temperature (from step 202) for a given region/layer is compared to a maximum duration of applied temperature (from step 204). Additionally, a cycling frequency for each region/layer (from step 202) is compared to a maximum cycling frequency (from step 204). The cross checking compares specifications of a region (e.g., a group of parts) against sensitivities of another region, either on the same layer or across layers in the chip stack 100. For example, the other region may be adjacent to the first region, or the other region may be on a separate layer than the first region. If on a separate layer, the other region may be aligned vertically or may be otherwise associated with the first layer by virtue of its testing specifications or other criteria.

At step 208, the controller determines if any of the comparisons from step 206 indicate a value from the specification (step 202) exceeds a sensitivity value (step 204). If not, the controller then determines if all regions/layers have been cross-checked at step 209. If so, the process proceeds to step 212. Otherwise, the process returns to step 206, whereby a set of comparisons is performed for a next region/layer.

If any of the values exceed corresponding sensitivity values at step 208, the affected region/layer is noted in a conflict list at step 210, and the process returns to step 209.

At step 212, the controller determines if conflict list is empty. If so, at step 214, the controller repeats the comparison checks C1-CN and determines if any full-stack stress test exceeds sensitivity levels. The comparison checks C1-CN are a series of tests between two regions on Temperature (Tburn-in of j>Tmax sustainable by region i), Voltage (Vdd Burn-in of i>Vdd max of region j), Duration and cycling frequency. The limits could be lower or upper bounds and there may be more tests, but the comparison checks of step 214 determine if the burn-in specification used by layer/region i would damage j if applied together to i and j at the same time.

If any full stack stress test exceeds sensitivity levels, the controller initiates an adjusted full stack burn-in at step 216 and the process ends at step 217. In this instance, the adjusted full stack burn-in accounts for the full stack sensitivity issues determined from step 214. The amount of intensity of testing is adjusted to accommodate the sensitivities of the full stack.

If no full stack stress test exceeds sensitivity levels at step 214, then the controller initiates a standard stress test at step 218 and the process ends at step 219.

Turning back to step 212, if the conflict list is not empty, this means there are one or more regions/layers in the chip stack that are affected by the stress testing of another region/layer. During a pre-stress analysis and regional stress specification simulation phase to engineer the proper stress conditions for each chip and region, a conflict may be discovered that can introduce stress conditions "out of spec" for one or more other regions on the chip. Thus, if the conflict list is not empty, a specification such as voltage, temperature, patterns, timing, etc. must be adjusted or regions must be shut down and run sequentially during stress. Accordingly, if there are any items in the conflict list at step 212, the process continues in FIG. 2B, whereby a partial stress test is determined to be applicable for the affected item(s) in the conflict list.

At step 220, the controller identifies a conflict item (i.e., an associated region and conditions) in the conflict list.

For each list item k in the conflict list, the controller calculates target conditions for region i ($V_{dd\_adjusted}$, $T_{adjusted}$) and for conflict regions listed ($V_{dd\_safe}$, $T_{safe}$) at step 222. Target conditions refer to desired test conditions that meet the overall test goals. At step 224, the controller determines if calculated targets with stack-level sensitivity levels checks have passed. If not, the process returns to step 222.

If the calculated targets with stack-level sensitivity level checks have passed, for each list item k in the conflict list, the controller activates and adjusts region i ($V_{dd\_adjusted}$, $T_{adjusted}$) at step 226. The controller also disables or adjusts conflict regions ($V_{dd\_safe}$, $T_{safe}$).

For each target condition, the controller activates needed front end/back end heaters (e.g., latches 132 or wiring 112 in FIG. 1) at step 228.

Figure 3:
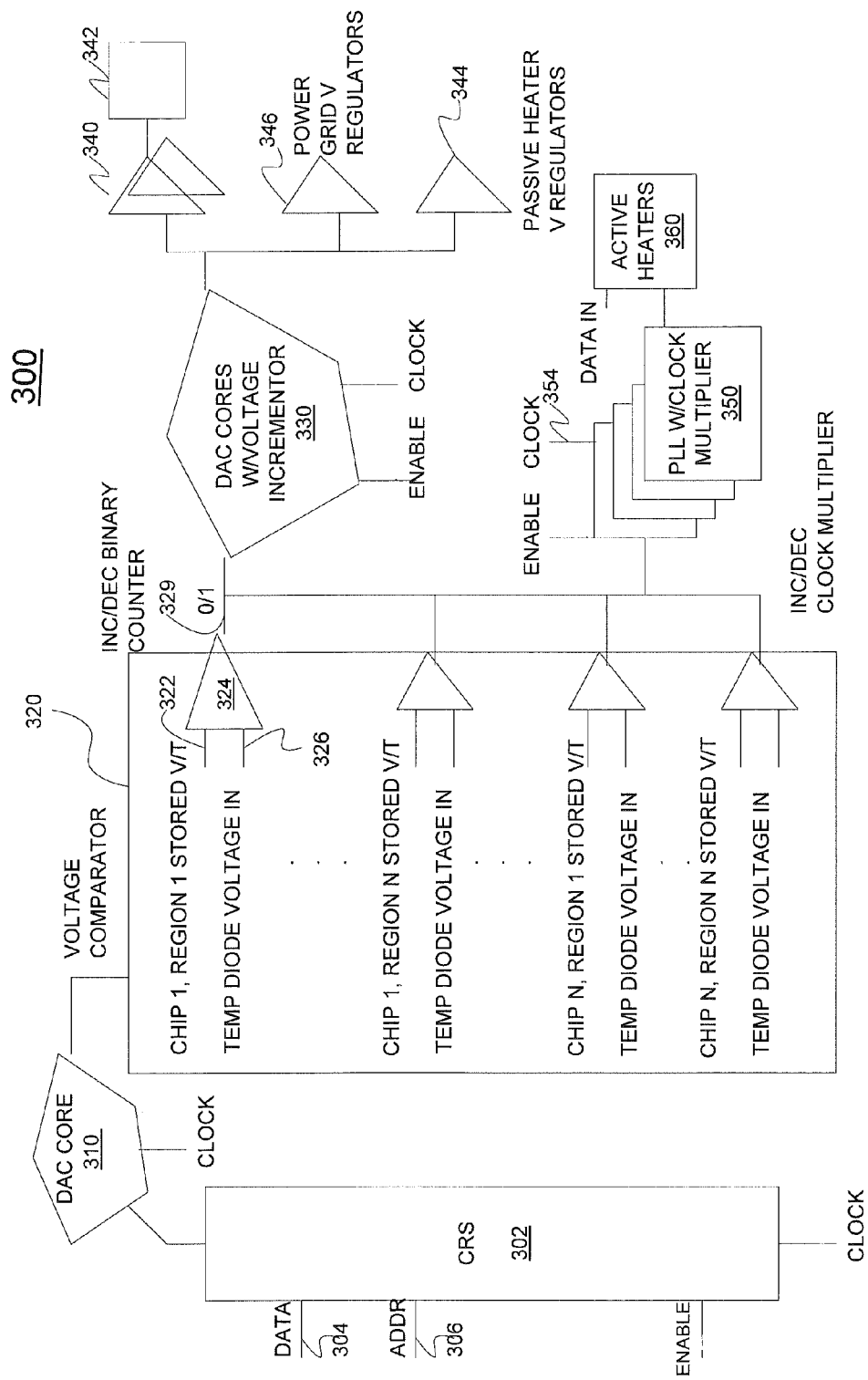
FIG. 3 depicts a block diagram of an embedded control system through which the test type determination and resulting testing of a heterogeneous three-dimensional computer processing chip stack may be implemented in an exemplary embodiment.

At step 230, the controller adjusts the voltage converter level to target $V_{dd}$ for regions (Ri-Rn) within the range of 0 volts to $V_{dd\_burn-in}$. These adjustments may be implemented via an on-chip digital-to-analog controller (DAC) or may be loaded as new voltage regulator values into voltage/temperature internal control registers (e.g., registers whose input are supplied to the controller (as shown in FIG. 3).

At step 232, adjustments determined at step 230 are implemented to achieve the required oven temperature. These adjustments may be applied to every applicable region or layer in the chip stack 100.

At step 234, the controller initiates spatial stress testing for region i.

At step 236, it is determined whether additional regions/layers exist for examination. If so, the process returns to step 220 for the next region/layer and condition. Alternatively, if there are no more regions/layers to examine, the process ends at step 238.

In an exemplary embodiment, the implementation of the spatial stress test type may be performed via an on-chip controller, off-chip controller, or a combination of both. If performed by a combination of on- and off-chip controllers, the ratio of each controller type used may be different for each chip design based upon factors, such as cost of implementation and ease of use. As shown in FIG. 3, an embedded control system 300 (i.e., on-chip) used in implementing the exemplary spatial stress testing will now be described.

In one embodiment, two control systems may be used collectively or independently: a tester can be used as part or all of the control system with a burn-in test interface (BTI), and/or an independent and automated on chip embedded spatial burn-in control system can be used (eSBCS). The embodiment shown in FIG. 3 illustrates an eSBCS implementation.

The system 300 sequentially compares actual on-chip in situ stress test conditions 326 to pre-calculated values 322 established, e.g., in FIG. 2. These values are then stored as the pre-determined target conditions in a serializer 302 of the system 300. Regional adjustments can then be made to balance the system for an accurate and well controlled spatial stress test. The system 300 is first initialized to set the stress test controller values (e.g., data 304) in the serializer 302. The tester can then can clock and access each address 306 in the serializer 302 to access each stored value. Stored values may include, e.g., calculated temperature (e.g., digital-to-analog voltage) of each region, power grid voltages, clock multiplier values for the stress test patterns' clock cycle times and duty cycles, and a region ID or select bits with enable and clock controls for each region. The values from the serializer 302 are converted by a digital-to-analog converter (DAC) 310 for processing by a voltage comparator 320. The system 300 then enables and reads thermal diode voltages 326 of each region back to the voltage comparator 320 where it can compare each region sequentially to its stored values 322. The on-chip stored stress test conditions 322 are then compared to the actual conditions 326 for each 3D chip and region and the results of the comparison (e.g., an output value 0,1) are output from the comparator 320 to a DAC with voltage incrementor 330, as well as to a phase-locked loop (PLL) with clock multiplier 350. Voltage regulators 346, passive (344) or active (360) heaters, and cooling systems 340/342 are continually adjusted by incrementing or decrementing on-chip DACs 330 and clock multipliers 350 that adjust voltage regulators 346, heater and functional test pattern clock speeds (e.g., via clock 354), power grid stress test voltages, and cooling controls for each region. A repeat loop may be conducted until all the stored stress test condition values match the actual measured temperature values and the entire chip stack 100 is balanced. If a system cannot be balanced to allow an all-chip and all-region parallel burn in, layers and regions can then be selectively disabled or periodically shut down to allow sequential stress testing of the entire chip stack 100. This may be implemented using clock gates and/or power switches (enable) built in to each regions control system.

Figure 4:
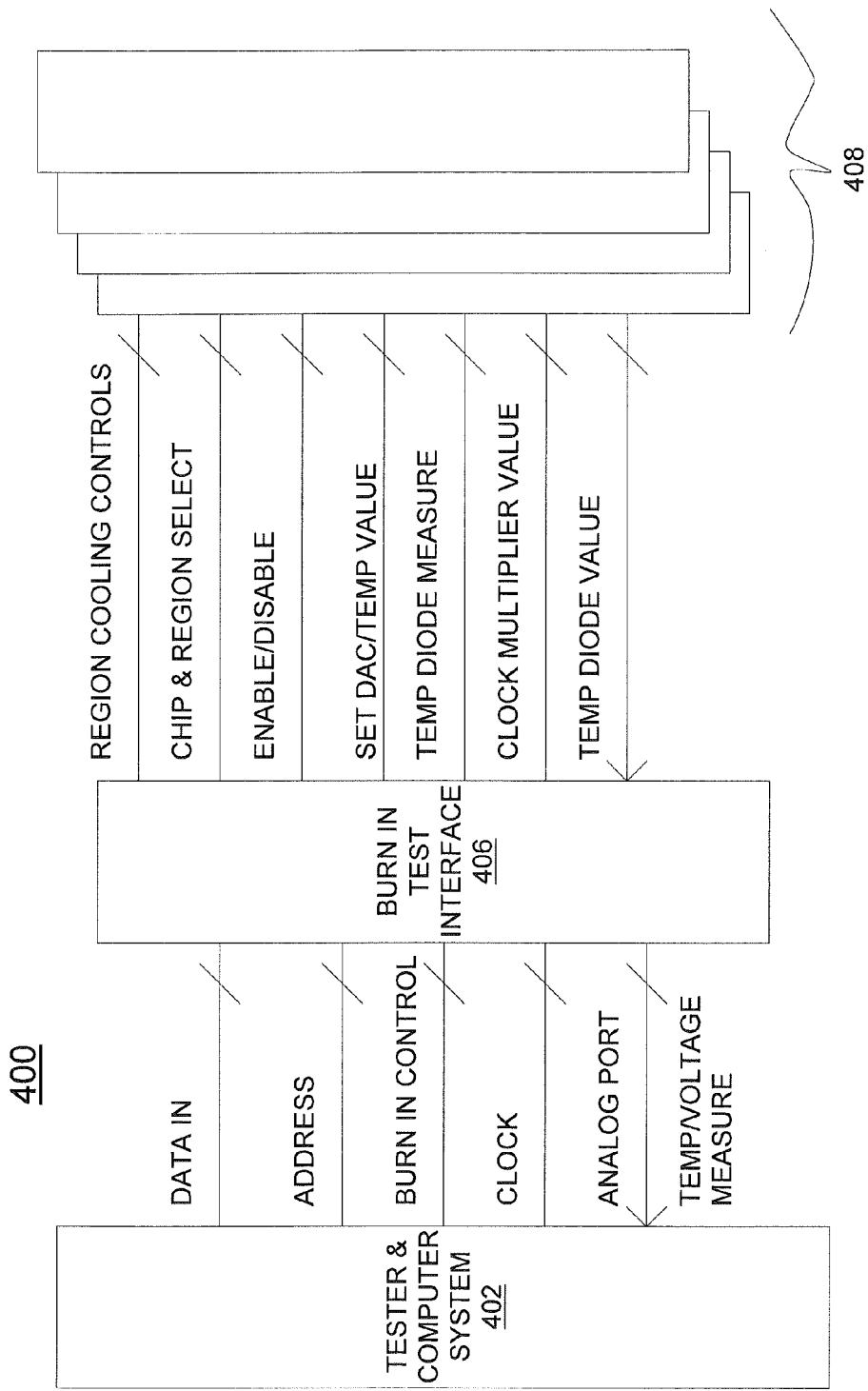
FIG. 4 depicts a block diagram of an external control system and, external tester and computer system upon which the test type determination and resulting testing of a heterogeneous three-dimensional computer processing chip stack may be implemented in an exemplary embodiment.

Turning now to FIG. 4, an off-chip implementation of the control system will now be described in an exemplary embodiment. The system 400 of FIG. 4 includes a tester and computer 402 as a primary control system whereby the stress test condition values are stored off chip (e.g., in a storage location accessible to the tester and computer system 402. The computer system includes a computer processor and logic for executing the exemplary processes described herein. Temperature, voltage, and current conditions of the chip stack 100 are monitored through analog or digital ports on the chip stack 100 and then compared to the stored values. If needed, new temperature, clock, voltage, and cooling control values may be loaded to adjust each region. These values can also be adjusted off chip by the tester and computer system 402 if enough ports are provided to externally contacted pins for each region. This is repeated in a loop until the entire system is balanced. The off chip tester and computer system 402 keep track of the region values and continually monitor them as they change during stress testing. These regions are referred to as burn-in regions 408 as shown in FIG. 4. Chip conditions under stress can change over time and under certain circuit functions while stimulating the design with test patterns, e.g., bus contention, circuit switching speeds controlled by clock speed and duty cycle, and enabling DC paths can abruptly change current and temperature conditions that need to be carefully monitored. These abrupt conditions can either over or under stress a circuit and expose it to damage or a poor stress. This can allow reliability defects to go undetected or cause unintended damage to the circuits. If a balanced system cannot be achieved or if there is excessive temperature or power current detected, regions (e.g., burn-in regions 408) can be periodically shut down or disabled to allow sequential stress testing of each layer or region. Software, e.g., via a burn-in test interface 406 may be used to carefully manage the stress testing of stacked die in a very organized and well controlled manner. This is vital to adequately stress the circuits and accelerate life conditions without damaging or exposing them to conditions exceeding the predetermined specifications for each heterogeneous technology and circuit design in the chip stack 100.

Technical effects and benefits include a system and process that selectively applies stress to different device layers on a chip in a 3D chip stack, as well as different regions within a layer in order to minimize the occurrence of burn-in related complications for the rest of the chip stack. Data from earlier design stages (e.g., test specifications and sensitivities) is made available and is analyzed in order to selectively stress the device layers and the corresponding intensities. The testing processes focus on the selective areas in the chip stack in a sequential fashion and otherwise avoid the aforementioned risks involved in performing a stack-level stress test The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As described above, embodiments may be embodied in the form of computer-implemented processes and apparatuses for practicing those processes. In exemplary embodiments, the invention is embodied in computer program code executed by one or more network elements. Embodiments include a computer program product on a computer usable medium with computer program code logic containing instructions embodied in tangible media as an article of manufacture. Exemplary articles of manufacture for computer usable medium may include floppy diskettes, CD-ROMs, hard drives, universal serial bus (USB) flash drives, or any other computer-readable storage medium, wherein, when the computer program code logic is loaded into and executed by a computer, the computer becomes an apparatus for practicing the invention. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the invention. When implemented on a general-purpose microprocessor, the computer program code logic segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

What is claimed is:

1. A method of testing a three-dimensional (3D) integrated circuit, the method comprising:
    defining a first group of parts by at least one of a region and a layer on the 3D integrated circuit;
    applying a first intensity of stress test conditions to the first group of parts on the 3D integrated circuit;
    defining a second group of parts by at least one of a region and a layer on the 3D integrated circuit that is different from the region or layer of the first group of parts;
    applying a second intensity of stress test conditions to the second group of parts on the 3D integrated circuit, the second intensity of stress test conditions different from the first intensity of stress test conditions, the second intensity of stress test conditions determined by sensitivities identified for each of the first group of parts and the second group of parts; and determining whether the 3D integrated circuit passed the testing based upon results of application of the first and second intensities of stress test conditions.

2. The method of claim 1, wherein the 3D integrated circuit is a heterogeneous chip stack, and the first group of parts comprises components having a technology that is different from a technology employed by components comprised of the second group of parts.

3. The method of claim 2, wherein the first group of parts and the second group of parts are disposed on two different layers in the 3D integrated circuit, the method further comprising at least one of:

using at least one of the layers and regions as a thermal buffer for at least one of another of the layers and regions, the thermal buffer mitigating effects of the stress test conditions during the testing; and using at least one of the layers and regions as a burn-in enhancer for at least one of another of the layers and regions, the burn-in enhancer boosting a temperature on the at least one of the layers and regions under test.

4. The method of claim 1, wherein the first group of parts is disposed adjacent to the second group of parts on a single layer of the 3D integrated circuit.

5. The method of claim 1, wherein the stress test conditions include temperature, voltage, and at least one of: duration of applied temperature, duration of applied voltage, frequency of applied temperature, and frequency of applied voltage.

6. The method of claim 1, wherein the first intensity of stress test conditions is applied simultaneously with the second intensity of stress test conditions.

7. The method of claim 1, further comprising:

applying a third intensity of stress test conditions to a third group of parts on the 3D integrated circuit simultaneously with the applying of the second intensity of stress test conditions, the third intensity of stress test conditions equal to the second intensity of stress test conditions;

wherein the second group of parts and the third group of parts are one of:

disposed on two different layers in the 3D integrated circuit; and adjacent to each other on the a single layer of the 3D integrated circuit.

8. The method of claim 1, further comprising:

selecting the intensities of stress test conditions to apply based on at least one of: design stages of the 3D integrated circuit, and earlier testing performing on the 3D integrated circuit.

9. The method of claim 8, wherein selecting the intensities of stress test conditions comprises:

for each group of parts in the 3D integrated circuit:

comparing stress test specifications to stress test sensitivity values of neighboring groups of parts on the 3D integrated circuit; and upon determining the stress test specifications exceed a sensitivity value of a neighboring group of parts on the 3D integrated circuit, selecting an intensity of the stress test conditions for the neighboring group of parts that is lower than an intensity of the stress test conditions for the group of parts under comparison.

10. The method of claim 1, wherein the testing is implemented by an on-chip controller with respect to the 3D integrated circuit.

11. The method of claim 1, wherein the testing is implemented by an off-chip controller with respect to the 3D integrated circuit.

12. The method of claim 1, wherein the testing is implemented by a combination of an on-chip controller and an off-chip controller with respect to the 3D integrated circuit.

13. A system of testing a three-dimensional (3D) integrated circuit, the system comprising:

a controller device in communication with the 3D integrated circuit, a voltage regulator, and a temperature actuator, the controller device including logic for implementing a method, the method comprising:

defining a first group of parts by at least one of a region and a layer on the 3D integrated circuit;

applying a first intensity of stress test conditions to the first group of parts on the 3D integrated circuit;

defining a second group of parts by at least one of a region and a layer on the 3D integrated circuit that is different from the region or layer of the first group of parts;

applying a second intensity of stress test conditions to the second group of parts on the 3D integrated circuit, the second intensity of stress test conditions different from the first intensity of stress test conditions, the second intensity of stress test conditions determined by sensitivities identified for each of the first group of parts and the second group of parts; and determining whether the 3D integrated circuit passed the testing based upon results of application of the first and second intensities of stress test conditions.

14. The system of claim 13, wherein the 3D integrated circuit is a heterogeneous chip stack, and the first group of parts comprises components having a technology that is different from a technology employed by components comprised of the second group of parts.

15. The system of claim 14, wherein the first group of parts and the second group of parts are disposed on two different layers in the 3D integrated circuit, the method further comprising at least one of:

using at least one of the layers and regions as a thermal buffer for at least one of another of the layers and regions, the thermal buffer mitigating effects of the stress test conditions during the testing; and using at least one of the layers and regions as a burn-in enhancer for at least one of another of the layers and regions, the burn-in enhancer boosting a temperature on the at least one of the layers and regions under test.

16. The system of claim 14, wherein the first group of parts is disposed adjacent to the second group of parts on a single layer of the 3D integrated circuit.

17. The system of claim 14, wherein the stress test conditions include temperature, voltage, and at least one of: duration of applied temperature, duration of applied voltage, frequency of applied temperature, and frequency of applied voltage.

18. The system of claim 14, wherein the first intensity of stress test conditions is applied simultaneously with the second intensity of stress test conditions.

19. The system of claim 14, wherein the method further comprises:

applying a third intensity of stress test conditions to a third group of parts on the 3D integrated circuit simultaneously with the applying of the second intensity of stress test conditions, the third intensity of stress test conditions equal to the second intensity of stress test conditions;

wherein the second group of parts and the third group of parts are one of:

disposed on two different layers in the 3D integrated circuit; and adjacent to each other on the a single layer of the 3D integrated circuit.

20. The system of claim 14, wherein the method further comprises:

selecting the intensities of stress test conditions to apply based on at least one of: design stages of the 3D integrated circuit, and earlier testing performing on the 3D integrated circuit.

21. The system of claim 20, wherein selecting the intensities of stress test conditions comprises:

for each group of parts in the 3D integrated circuit:

comparing stress test specifications to stress test sensitivity values of neighboring groups of parts on the 3D integrated circuit; and upon determining the stress test specifications exceed a sensitivity value of a neighboring group of parts on the 3D integrated circuit, selecting an intensity of the stress test conditions for the neighboring group of parts that is lower than an intensity of the stress test conditions for the group of parts under comparison.

22. The system of claim 14, wherein the controller device is implemented as an on-chip controller with respect to the 3D integrated circuit.

23. The system of claim 14, wherein the controller device is implemented as an off-chip controller with respect to the 3D integrated circuit.

24. The system of claim 14, wherein the controller device is implemented as a combination of an on-chip controller and an off-chip controller with respect to the 3D integrated circuit.

25. The system of claim 14, wherein the temperature actuator is at least one of [a]n:

logic based temperature actuator;

a wire-based temperature actuator; and liquid cooling channels.

* * * * *